(12) United States Patent
Son et al.

(10) Patent No.: US 6,505,634 B2
(45) Date of Patent: Jan. 14, 2003

(54) SEMICONDUCTOR WAFER CLEANING APPARATUS

(75) Inventors: So-Lip Son, Kyungki-do (KR); Han-Joo Lee, Kyungki-do (KR)

(73) Assignee: Will Be S & T Co., Ltd. (KR)

( * ) Notice: Subject to any disclaimer, the term of this patent is extended or adjusted under 35 U.S.C. 154(b) by 120 days.

(21) Appl. No.: 09/816,587

(22) Filed: Mar. 23, 2001

(65) Prior Publication Data

US 2002/0134410 A1 Sep. 26, 2002

(51) Int. Cl.[7] .................................................. B08B 3/04
(52) U.S. Cl. ..................... 134/104.4; 134/133; 134/147; 134/155; 134/157; 134/902
(58) Field of Search ............................... 134/902, 104.4, 134/133, 135, 147, 148, 155, 157, 161

(56) References Cited

U.S. PATENT DOCUMENTS 5,431,178 A * 7/1995 Chiu ....................... 134/153 X
6,267,125 B1 * 7/2001 Bergman et al. ........ 134/153 X

FOREIGN PATENT DOCUMENTS

| JP | 12576 | * | 1/1977 | ................. 134/902 |
| JP | 164225 | * | 7/1986 | ................. 134/902 |

* cited by examiner

*Primary Examiner*—Philip Coe
(74) *Attorney, Agent, or Firm*—Cooper & Dunham LLP

(57) ABSTRACT

The object of this invention is to provide a semiconductor wafer cleaning apparatus designed to clean several wafers at the same time while rotating the wafers held in a horizontal, laid-down position. In an operation of this apparatus, a wafer feeding robot arm 20 feeds wafers 60 from a wafer cassette 10 to a wafer boat 50 and seats the wafers in the wafer boat while maintaining a horizontal, laid-down position of the wafers. The wafer boat 50, with the horizontally laid-down wafers 60, is vertically moved downward by a boat drive unit 40 to be immersed in a wafer cleaning liquid flowing in a wafer cleaning bath 30. Thereafter, the boat 50 is rotated within the wafer cleaning liquid, and so the wafers 60 are washed and cleaned by the wafer cleaning liquid while being maintained in the horizontal, laid-down position and being rotated horizontally.

7 Claims, 6 Drawing Sheets

SEMICONDUCTOR WAFER CLEANING APPARATUS

BACKGROUND OF THE INVENTION

1. Field of the Invention

The present invention relates, in general, to semiconductor wafer cleaning apparatuses and, more particularly, to an improvement in such a wafer cleaning apparatus to clean several wafers at the same time while rotating the wafers held in a horizontal, laid-down position.

2. Description of the Prior Art

In order to clean and etch conventional small-sized semiconductor wafers having a diameter of not larger than 200 mm during a semiconductor producing process in the prior art, a plurality of wafers are primarily held in a vertically holding-type wafer cassette, which holds the wafers in a vertical, standing position. The vertically holding-type wafer cassette with the wafers is, thereafter, immersed in a wafer cleaning bath by a robot arm prior to performing a desired wafer cleaning and etching process in said bath.

However, in recent years, the semiconductor wafers trend to be enlarged in their diameters to 300mm or more, and horizontally holding-type wafer cassettes, designed to hold such large-sized wafers in a horizontal, laid-down position, have been proposed and used. Such horizontally holding-type wafer cassettes include two standardized types: front opening unified pod-type cassettes and open-type cassettes.

When a conventional wafer cleaning bath, originally designed to clean the 200 mm-diameter wafers, is used with the 300 mm-diameter wafers, it is necessary to use a wafer position changing device, which has a complex construction and is used for changing the position of the 300 mm-diameter wafers from a horizontal, laid-down position in the cassette to a vertical, standing position prior to immersing the wafers in the wafer cleaning bath. The use of such wafer position changing devices is inconvenient to users as follows.

That is, such a wafer position changing device, used for changing the position of the 300 mm-diameter wafers from the horizontal, laid-down position in the cassette to the vertical, standing position prior to immersing the wafers in the conventional wafer cleaning bath originally used with 200 mm-diameter wafers, undesirably enlarges the installation area required for the semiconductor producing system. In addition, the 300 mm-diameter wafers are inevitably exposed to the atmosphere for a predetermined period of time during such a wafer position changing process, and so the wafers are undesirably oxidized, and easily contaminated with impurities on their surfaces during such a wafer position changing process. The wafer position changing process also lengthens the processing time while immersing the wafers in the cleaning bath or taking the wafers out of the bath, thus deteriorating the productivity during a semiconductor producing process. Furthermore, the wafers are inevitably brought into contact with the wafer position changing device during the wafer position changing process, thus undesirably increasing the contamination of the wafer surfaces. Another problem experienced in the use of the wafer position changing device resides in that the device increases the equipment cost of the semiconductor producing system, and increases the production cost of semiconductor products.

SUMMARY OF THE INVENTION

Accordingly, the present invention has been made keeping in mind the above problems occurring in the prior art, and an object of the present invention is to provide a semiconductor wafer cleaning apparatus, which cleans a plurality of wafers at the same time in a wafer cleaning bath while rotating the wafers held in a horizontal, laid-down position, and preferably removes the conventional wafer position changing device from a semiconductor producing system.

In order to accomplish the above object, the present invention provides a semiconductor wafer cleaning apparatus, including a wafer feeding robot arm used for feeding wafers from a wafer cassette to a wafer boat and seating the wafers in the boat while maintaining a horizontal, laid-down position of the wafers. The wafer boat, with the horizontally laid-down wafers, is vertically moved downward by a boat drive unit to be immersed in a wafer cleaning liquid flowing in a wafer cleaning bath. Thereafter, the boat is rotated within the wafer cleaning liquid, and so the wafers are washed and cleaned by the wafer cleaning liquid while being maintained in the horizontal, laid-down position and being rotated horizontally. The apparatus does not requires the wafers to be changed in their positions from a horizontal, laid-down position to a vertical, standing position during a wafer cleaning process, and so the apparatus preferably removes the conventional wafer position changing device from a semiconductor producing system. This apparatus thus reduces the area for installing the system, and reduces the time the wafers are exposed to the atmosphere, and improves productivity while producing wafers.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Reference now should be made to the drawings, in which the same reference numerals are used throughout the different drawings to designate the same or similar components.

FIGS. 1 to 9 are views, showing the construction and operation of a semiconductor wafer cleaning apparatus in accordance with the preferred embodiment of the present invention. As shown in the drawings, the semiconductor wafer cleaning apparatus of this invention comprises a plurality of wafer cassettes 10, a wafer feeding robot arm 20, a plurality of wafer boats 50, a plurality of boat drive units 40, a plurality of wafer cleaning baths 30. In the apparatus of this invention, the wafer cassettes 10 hold a plurality of wafers 60 in a horizontal, laid-down position, while the robot arm 20 feeds the wafers 60 from the wafer cassettes 10 to the boats 50 while maintaining the horizontal, laid-down position of the wafers 60. The boats 50 seat the wafers 60 received from the robot arm 20 therein while maintaining the horizontal, laid-down position of the wafers 60. The boat drive units 40 vertically move the boats 50 in opposite directions, and rotate the boats 50. Each of the baths 30 receives one boat 50, and allows the boat 50 to be immersed in a wafer cleaning liquid prior to performing a wafer cleaning process. The above baths 30 each have a cleaning liquid inlet opening.

In the apparatus of this invention, a conventional standardized wafer cassette designed to hold wafers in a horizontal, laid-down position is used as each of the cassettes 10. In addition, the robot arm 20, used for feeding the wafers 60 from the cassettes 10 to the boats 50, may be preferably selected from conventional robot arms having been preferably used in the art.

In order to perform a wafer cleaning process, the robot arm 20 takes a wafer 60 out of a wafer cassette 10, and feeds the wafer 60 to a boat 50 while maintaining the horizontal, laid-down position of the wafer 60 so as to seat the wafer 60 in the boat 50 in said horizontal, laid-down position.

Figure 6:
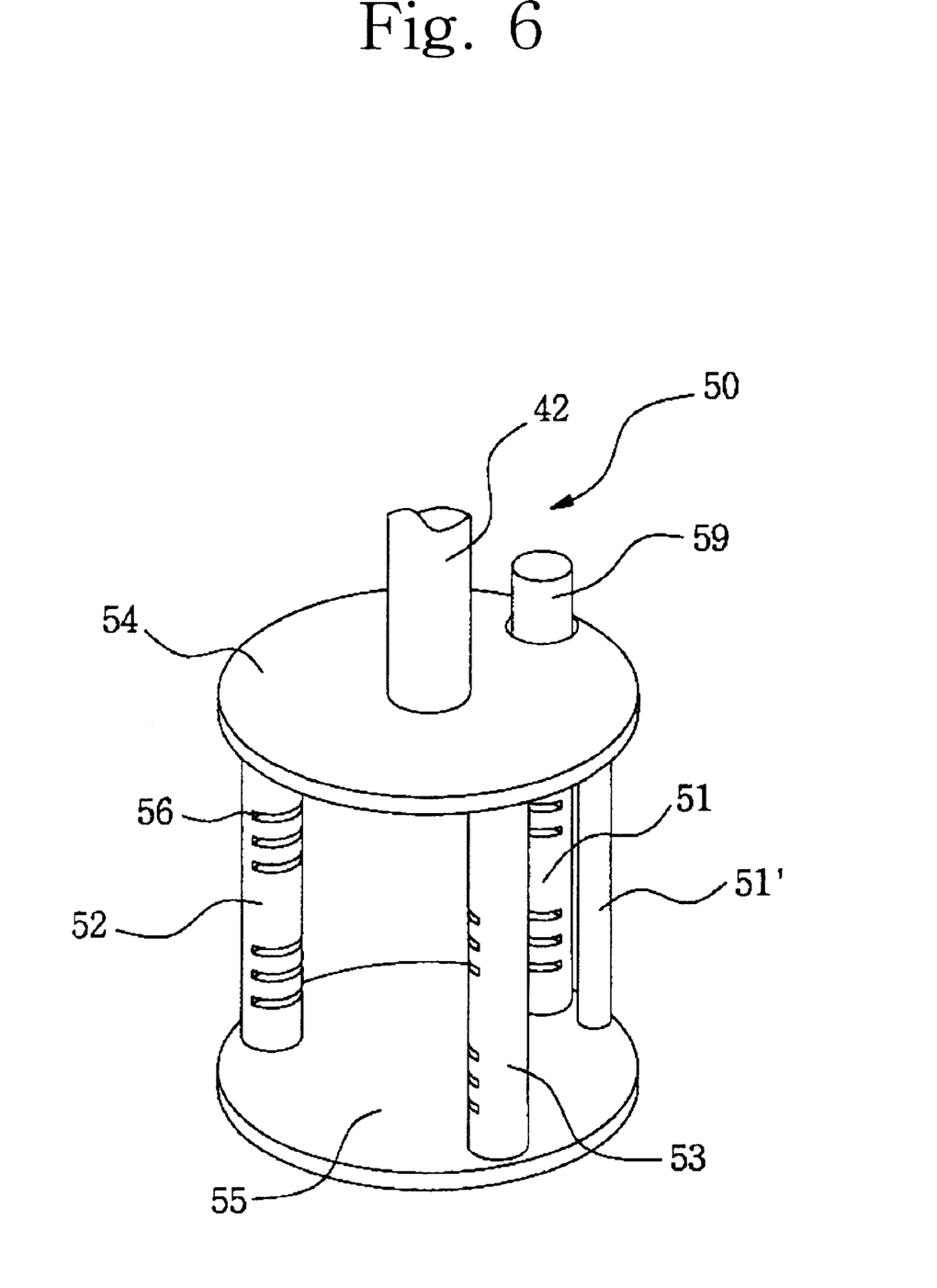
FIG. 6 is a perspective view of a wafer boat included in the semiconductor wafer cleaning apparatus of this invention.
Figure 7:
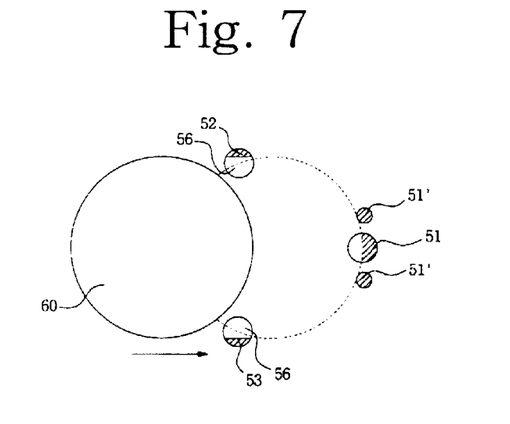
FIG. 7 is a plan sectional view, showing a semiconductor wafer when the wafer is moved into the wafer boat of this invention to be held by wafer holding rods in the boat.
Figure 8:
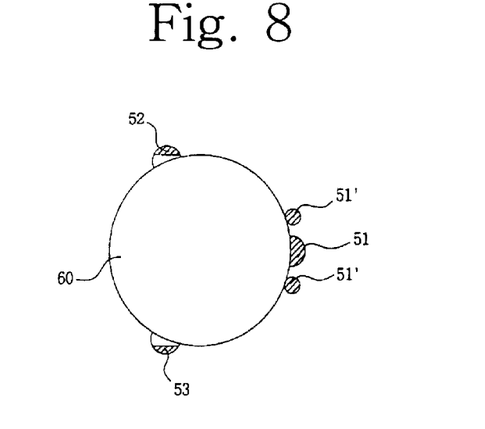
FIG. 8 is a plan sectional view, showing the semiconductor wafer after the wafer is completely set in the wafer boat of this invention.
Figure 9:
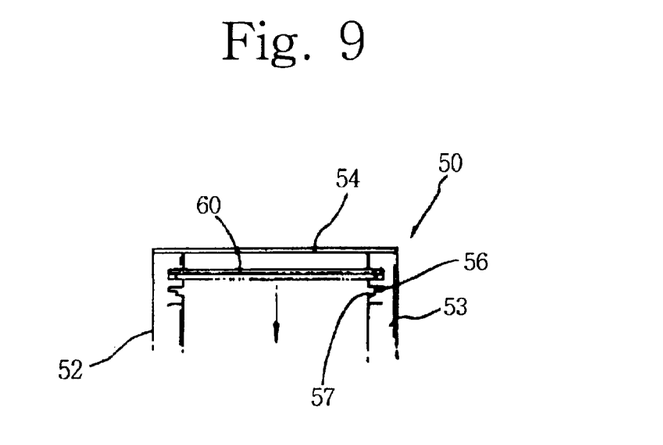
FIG. 9 is a front view, showing the semiconductor wafer when the wafer is completely set in the wafer boat of this invention.

Each of the wafer boats 50 comprises two plates: upper and lower plates 54 and 55 that are parallely spaced apart from each other and are connected together by a plurality of, for example, three vertical connection rods 51, 52 and 53 as shown in FIG. 6. Of the three rods 51, 52 and 53, the first rod 51 is designed to be pulled upward by a rod drive unit 59, which is installed on the upper plate 54 of the boat 50, so as to incline the wafers 60 held in the boat 50 when the boat 50 is immersed in or taken out of the wafer cleaning liquid contained in a bath 30 as will be described in detail later herein. On the other hand, the second and third rods 52 and 53 are fixed to the upper and lower plates 54 and 55 at their opposite ends so as to maintain the horizontal, parallel position of the two plates 54 and 55. In such a case, since the first rod 51 is vertically movable relative to the upper and lower plates 54 and 55, it may fail to maintain the horizontal, parallel position of the two plates 54 and 55. It is thus necessary to secondarily hold the upper and lower plates 54 and 55 at a position around the first rod 51. In the preferred embodiment of this invention, the above object is accomplished by two sub-connection rods 51', which are vertically fixed to the upper and lower plates 54 and 55 at their opposite ends as best seen in FIGS. 7 and 8. The above sub-connection rods 51' also guide the edge of a wafer 60 at the position around the first rod 51 when the wafer 60 is seated in the boat 50. In addition, each of the three rods 51, 52 and 53 is provided with a plurality of wafer receiving notches 56 at its outer surface. A wafer seat 57 is formed at the lower edge of each notch 56 and seats the edge of the wafer 60 thereon. In such a case, each of the wafer seats 57 communicates with an associated notch 56. When the wafer 60 is completely received into the notches 56 of the three rods, the wafer 60 moves slightly downward to be seated on the wafer seats 57 of the three rods as best seen in FIG. 9.

In the present invention, the number of the notches 56 with the seats 57 is determined in accordance with a desired number of wafers 60 to be seated in each boat 50 during a wafer cleaning process.

Of the three rods 51, 52 and 53 of each boat 50, the second and third rods 52 and 53, arranged at the front portion of the boat 50, are designed in that the inner edges of their notches 56 are spaced apart from each other by a gap slightly larger than the diameter of the wafer 60, thus allowing the wafer 60 to smoothly pass through the notches 56 of the two front rods 52 and 53 during a wafer seating process as best seen in FIGS. 7 and 8. When the wafer 60 is completely received into the notches 56 of the three rods 51, 52 and 53, the wafer 60 moves slightly downward to be stably seated on the wafer seats 57 of the three rods as shown in FIG. 9.

In such a case, the diameter of a circle formed by the inner edges of the wafer seats 57 of the three rods 51, 52 and is equal to or slightly larger than that of the wafer 60. In addition, the two sub-connection rods 51' are not provided with such wafer receiving notches 56 or wafer seats 57, and are positioned in the boat 50 such that the edge of the wafer 60 is tangentially guided by the outer surfaces of the two sub-rods 51' when the wafer 60 is completely seated in the boat 50.

Figure 1:
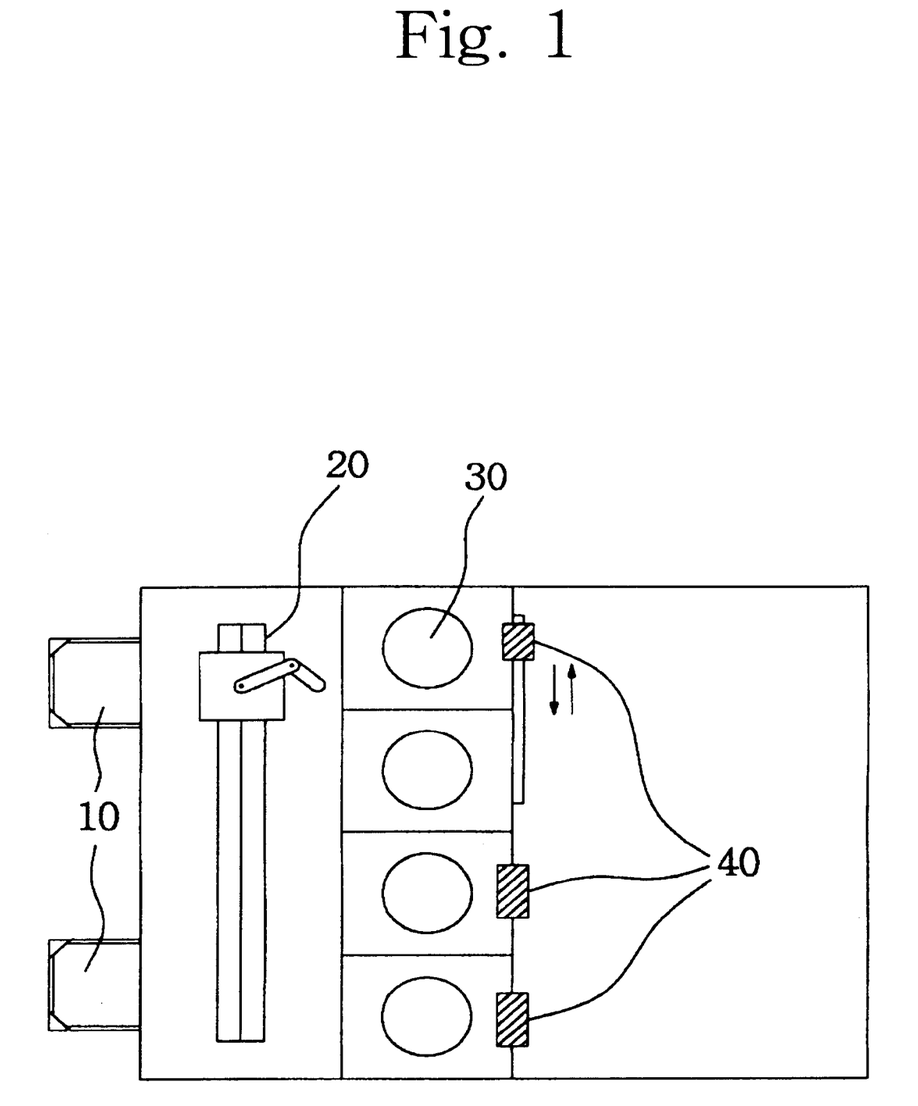
FIG. 1 is a plan view of a semiconductor wafer cleaning apparatus in accordance with the preferred embodiment of the present invention.
Figure 2:
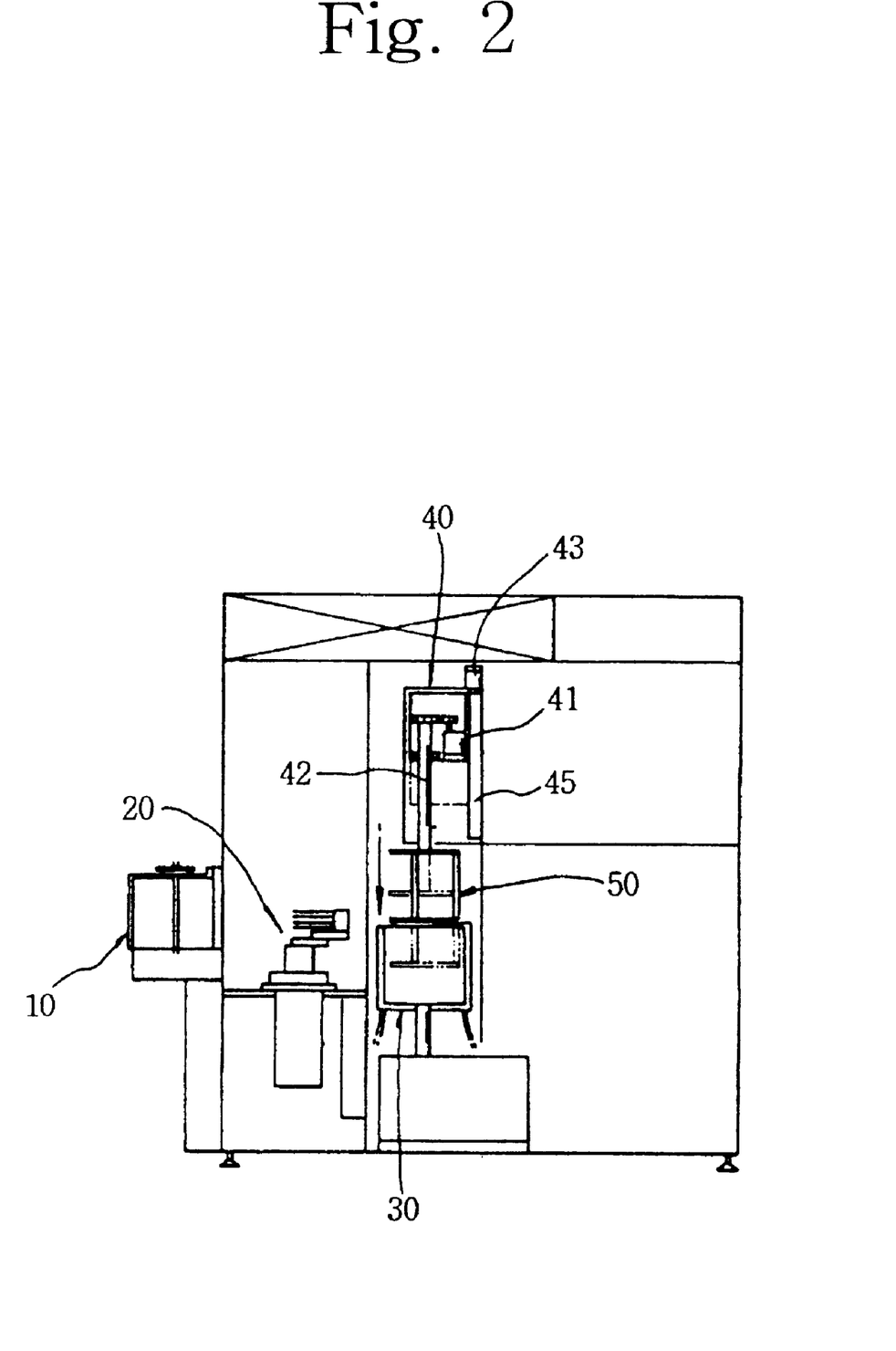
FIG. 2 is a side view of the semiconductor wafer cleaning apparatus of this invention.
Figure 3:
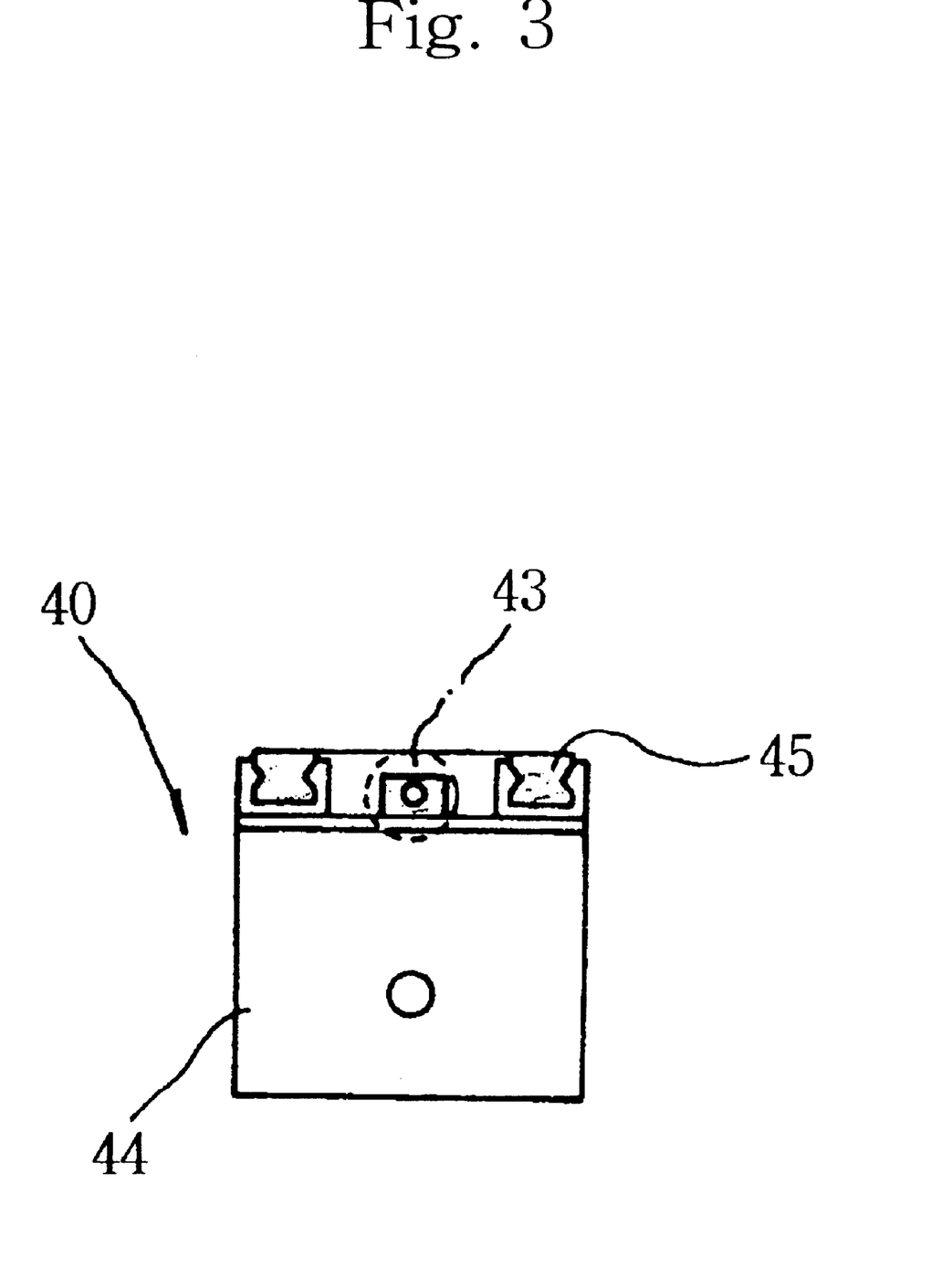
FIG. 3 is a plan view of a boat drive unit included in the semiconductor wafer cleaning apparatus of this invention.

Each of the boat drive units 40 comprises a boat rotating motor 41 and a boat lifting motor 43 as shown in FIG. 2. The boat rotating motor 41 is connected to the rotating shaft 42 of the boat 50 so as to rotate the shaft 42, while the boat lifting motor 43 vertically moves a wafer holding panel 44 in opposite directions under the guide of two vertical guide rails 45, thus vertically moving the wafers upward or downward. When the wafers 60 are completely seated in the boat 50, the lifting motor 43 is operated to vertically move the boat 50 downward until the boat 50 is immersed in an associated cleaning bath 30. Thereafter, the rotating motor 41 is started to rotate the rotating shaft 42 of the boat 50, thus rotating the boat 50.

It is necessary to reduce the hydraulic resistance acting on the wafers 60 held in the boat 50 when the boat 50 with the wafers 60 is immersed in the cleaning bath 30 or is taken out of the bath 30. In order to accomplish the above object, the rod drive unit 59 is installed on the upper plate 54 of the boat 50 while being connected to the first connection rod 51. When the boat 50 with the wafers 60 is immersed in the cleaning bath 30, the rod drive unit 59 is operated in a direction to vertically move the first rod 51 upward, thus inclining the wafers 60 relative to the upper and lower plates 54 and 55 at a predetermined angle of inclination and reducing the hydraulic resistance acting on the wafers 60 during such an immersing process. After the boat 50 is completely immersed in the cleaning bath 30, the rod drive unit 59 is operated in a reverse direction to vertically move the first rod 51 downward, thus allowing the wafers 60 to restore their horizontal, laid-down position in the boat 50 immersed in the bath 30. When the boat 50 with the wafers 60 is taken out of the cleaning bath 30, the rod drive unit 59 is operated in the same manner as that described above to reduce the hydraulic resistance acting on the wafers 60.

Figure 4:
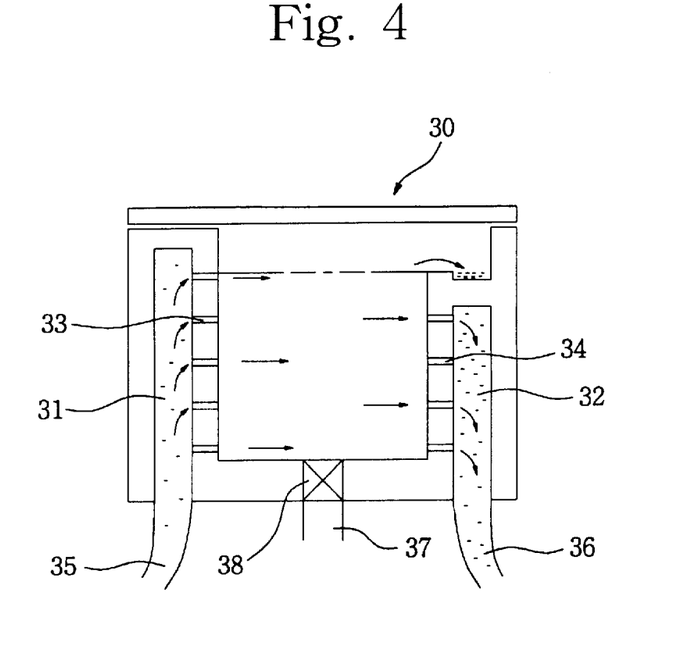
FIG. 4 is a front sectional view of a wafer cleaning bath included in the semiconductor wafer cleaning apparatus of this invention.
Figure 5:
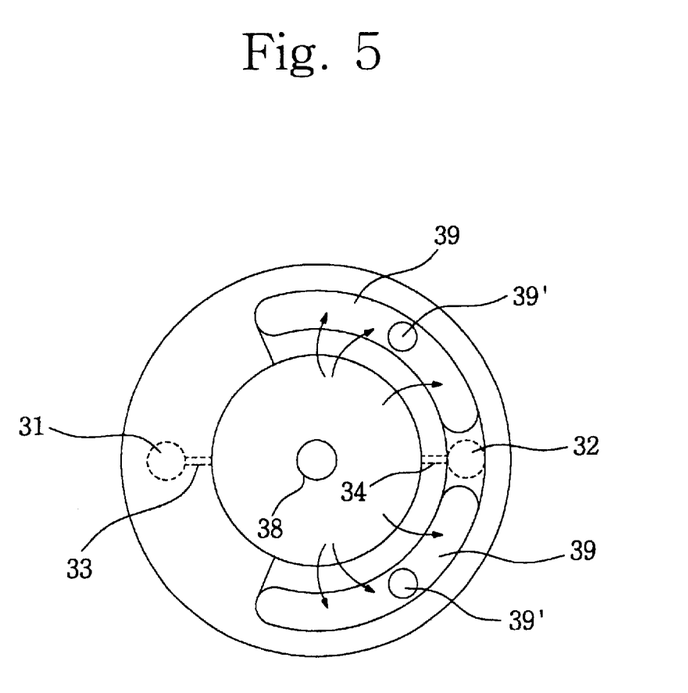
FIG. 5 is a plan view of the wafer cleaning bath included in the semiconductor wafer cleaning apparatus of this invention.

Each of the wafer cleaning baths 30 has a double-walled cylindrical structure with inner and outer walls as shown in FIG. 4. Each bath 30 includes a liquid injection chamber 31 and a liquid discharge chamber 32 at the space formed between the inner and outer walls. A plurality of liquid injection nozzles 33 are formed on the inner wall of the double-walled bath 30 at a position around the liquid injection chamber 31, and are used for injecting a wafer cleaning liquid from the liquid injection chamber 31 into the interior of the bath 30. Meanwhile, a plurality of liquid discharge nozzles 34 are formed on the inner wall of the double-walled bath 30 at a position around the liquid discharge chamber 32, and are used for discharging the wafer cleaning liquid from the interior of the bath 30 to the liquid discharge chamber 32. The two chambers 31 and 32 are tightly sealed from each other. The sidewall of each cleaning bath 30 also includes two impurity drain ports 39 and 39' extending to the outside of the bath 30. In such a case, the top edge of the outer wall of the double-walled bath 30 is higher than that of the inner wall, and so it is possible for impurities laden in the wafer cleaning liquid current to be drained from the interior of the bath 30 to the impurity drain ports 39 and 39' while flowing over the top edge of the inner wall prior to being drained to the outside of the bath 30. At the lower portion of each bath 30, the liquid injection chamber 31 is connected to a liquid injection pipe 35, while the liquid discharge chamber 32 is connected to a liquid discharge pipe 36. A liquid drain port 37 is formed on the bottom wall of each cleaning bath 30, and is used for quickly draining the wafer cleaning liquid from the interior of the bath 30 to a liquid tank through a liquid drain pipe when necessary.

A flow control valve 38 is provided at the liquid drain port 37 for controlling the opening ratio of the drain port 37.

During an operation of the wafer cleaning apparatus of this invention, the robot arm 20 takes a wafer 60 from the wafer cassette 10 while maintaining the horizontal, laid-down position of the wafer 60, and feeds the wafer 60 to a boat 50 so as to seat the wafer 60 in the boat 50 while maintaining the horizontal, laid-down position of the wafer 60.

During such a wafer feeding and seating process, the robot arm 20 takes the wafer 60 from the cassette 10 and feeds the wafer 60 to the boat 50 while holding the wafer 60 using vacuum or gravity. Such vacuum- or gravity-type holding technique used in the robot arm 20 has been conventionally and widely used in wafer cleaning processes, and further explanation is thus not deemed necessary.

When the wafer 60 held on the robot arm 20 completely reaches the boat 50, the robot arm 20 seats the wafer 60 in the boat 50. In such a case, the wafer 60 smoothly passes through the notches 56 of the two front connection rods 52 and 53 at a position within the space defined by the upper and lower plates 54 and 55. When the wafer 60 is completely received into the notches 56 of the three connection rods 51, 52 and 53, the wafer 60 moves slightly downward to be seated on the wafer seats 57 of the three rods 51, 52 and 53 in a horizontal, laid-down position.

When the wafer 60 is completely seated on the wafer seats 57 of the three connection rods 51, 52 and 53 in the horizontal, laid-down position as described above, it is impossible for the wafer 60 to be unexpectedly removed from the wafer seats 57. When it is desired to take the wafer 60 out of the boat 50 after a wafer cleaning process, it is necessary to primarily, vertically move the wafer 60 upward using the robot arm 20 to allow the wafer 60 to reach the notches 56 of the three connection rods 51, 52 and 53. Thereafter, the wafer 60 is removed from the boat 50 by drawing the wafer 60 out of the notches 56.

When a desired number of wafers 60 are completely seated in the boat 50, the boat lifting motor 43 is operated to vertically move the wafer holding panel 44 downward under the guide of the guide rails 45. The boat 50 with the wafers 60 is thus immersed in the cleaning bath 30 until the wafers. 60 held in the boat 50 are completely immersed in the wafer cleaning liquid of the bath 30.

When the boat 50 with the wafers 60 is immersed in the cleaning bath 30 as described above, the rod drive unit 59 installed on the upper plate 54 of the boat 50 is operated in a direction to vertically move the first rod 51 upward, thus inclining the wafers 60 relative to the upper and lower plates 54 and 55 at a predetermined angle of inclination and reducing the hydraulic resistance acting on the wafers 60 during such a wafer immersing process. After the boat 50 is completely immersed in the cleaning bath 30, the rod drive unit 59 is operated in a reverse direction to vertically move the first rod 51 downward, thus allowing the wafers 60 to restore their horizontal, laid-down position in the boat 50 immersed in the bath 30.

During a wafer cleaning process within the cleaning bath 30, the wafer cleaning liquid, pressurized at the liquid injection pipe 35, is continuously injected from the liquid injection chamber 31 into the interior of the bath 30 through the liquid injection nozzles 33. Therefore, the liquid continuously flows in the bath 30. The liquid is, thereafter, discharged from the interior of the bath 30 to the liquid discharge chamber 32 through the liquid discharge nozzles 34, and is drained to the outside of the bath 30 through the liquid discharge pipe 36.

When the boat 50 is immersed in the wafer cleaning liquid within the bath 30, the wafers 60 held in the boat 50 are washed and cleaned by the liquid current flowing in the bath 30 from the liquid injection nozzles 33 to the liquid discharge nozzles 34. In such a case, the boat 50 is rotated horizontally within the liquid by the boat rotating motor 41, the wafer cleaning effect is improved.

That is, during a wafer cleaning process, the boat 50 holding a plurality of wafers 60 therein moves downward by the boat lifting motor 43 to be immersed in the wafer cleaning liquid flowing in the bath 30. After the boat 50 is completely immersed in the liquid, the boat rotating motor 41 is activated to rotate the rotating shaft 42 along with the boat 50, thus rotating the wafers 60 within the liquid contained in the bath 30.

Therefore, the rotated wafers 60 are effectively washed and cleaned by the liquid current flowing in the bath 30 from the liquid injection nozzles 33 to the liquid discharge nozzles 34.

In the wafer cleaning bath 30, the liquid discharge chamber 32 is partially sealed, with the two impurity drain ports 39 and 39' formed in the bath 30 at a position around the liquid discharge chamber 32 while communicating with the outside of the bath 30. In such a case, the top edge of the outer wall of the double-walled bath 30 is higher than that of the inner wall, and so impurities laden in the wafer cleaning liquid current overflow from the interior of the bath 30 to the impurity drain ports 39 and 39' prior to being drained to the outside of the bath 30.

Since the wafers 60 held in the boat 50 are washed and cleaned by the wafer cleaning liquid within the bath 30 while being rotated along with the boat 50 during a wafer cleaning process, it is possible for the wafer cleaning apparatus of this invention to effectively wash and clean several ten wafers 60 at the same time. In addition, the apparatus accomplishes a uniform etching rate on the wafer surfaces, and almost completely removes impurities and particles from the wafer cleaning liquid, in addition to reducing the processing time during the wafer cleaning process.

After the wafers 60 are completely washed and cleaned, the flow control valve 38 is opened to quickly drain the wafer cleaning liquid from the interior of the bath 50 to a drain tank through the liquid drain port 37. In the apparatus of this invention, it is possible to dry the interior of the bath 30 as desired after completely emptying the bath 30. During such a bath drying process, it is preferable to feed appropriate gas, such as isopropyl alcohol gas (IPA gas), into the bath 30 so as to improve the bath drying effect.

When the wafers 60 are completely washed and cleaned as described above, the boat rotating motor 41 is primarily stopped. Thereafter, the boat lifting motor 43 is rotated in a reverse direction to vertically move the boat 50 upward prior to allowing the robot arm 20 to take the wafers 60 out of the boat 50 one by one, and store the wafers 60 in a desired wafer cassette 10 to end the wafer cleaning process.

As described above, the present invention provides a semiconductor wafer cleaning apparatus, which cleans a plurality of wafers at the same time in a wafer cleaning liquid current flowing in a wafer cleaning bath while rotating the wafers held in a horizontal, laid-down position. This apparatus does not require the 300 mm-diameter wafers to be changed in their positions from a horizontal, laid-down position to a vertical, standing position during a wafer cleaning process, and so the apparatus preferably removes the conventional wafer position changing device from a semiconductor producing system. This apparatus thus simplifies the construction of the semiconductor producing system, and reduces the equipment cost of such systems. The apparatus also reduces the time the wafers are exposed to the atmosphere, improves productivity while producing wafers, and almost completely prevents the wafers from coming into contact with contaminants when the wafers are fed during a wafer cleaning process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor wafer cleaning apparatus, comprising:
    a wafer feeding robot arm used for feeding a wafer from a wafer cassette while maintaining a horizontal, laid-down position of said wafer;
    a wafer boat seating a plurality of wafers received from said robot arm therein while maintaining the horizontal, laid-down position of the wafers;
    a boat drive unit vertically moving said wafer boat in opposite directions, and horizontally rotating the boat; and
    a wafer cleaning bath receiving the wafer boat vertically moved downward by the boat drive unit, with a plurality of liquid injection and discharge nozzles formed on a sidewall of said bath so as to inject a wafer cleaning liquid into the bath and discharge the liquid from the bath to an outside of the bath while forming a liquid current within said bath,
    whereby the wafers are washed and cleaned by the wafer cleaning liquid contained in the bath while being maintained in the horizontal, laid-down position and being rotated horizontally.

2. The semiconductor wafer cleaning apparatus according to claim 1, wherein said wafer boat comprises:
    upper and lower plates parallely arranged while being spaced apart from each other; and
    a plurality of vertical connection rods connecting the upper and lower plates to each other, said connection rods being regularly spaced apart from each other and consisting of one movable rod designed to be vertically movable relative to the upper and lower plates and one or more fixed rods connected to the upper and lower plates at their opposite ends to maintain a horizontal, parallel position of said plates, with a plurality of wafer receiving notches formed on an outer surface of each of the connection rods, and a wafer seat formed at a lower edge of said notch to communicate with the notch and used for seating an edge of a wafer thereon, said connection rods being also arranged such that inner edges of the wafer receiving notches formed on the connection rods positioned at a wafer inlet portion of said boat are spaced apart from each other by a gap slightly larger than a diameter of the wafer, and the wafer seats of the connection rods being spaced apart from each other by a gap equal to the diameter of the wafer and seating the wafer thereon while preventing the wafer from being undesirably moved in the boat.

3. The semiconductor wafer cleaning apparatus according to claim 2, wherein a rod drive unit is installed on the upper plate of the boat while being connected to said movable connection rod, said rod drive unit being operated in a direction to vertically move the movable connection rod upward relative to the upper and lower plates and incline the wafers held in the boat at a predetermined angle of inclination, thus reducing a hydraulic resistance acting on the wafers during a wafer immersing process or a wafer taking-out process, said rod drive unit being also operated in a reverse direction to vertically move the connection rod downward relative to the upper and lower plates after the boat is completely immersed in the cleaning bath or completely taken out of the bath, thus allowing the wafers to restore their horizontal, laid-down position.

4. The semiconductor wafer cleaning apparatus according to claim 2, wherein at least one sub-connection rod is connected to the upper and lower plates at its opposite ends at a position around the movable connection rod, thus maintaining the horizontal, parallel position of the upper and lower plates while guiding an edge of a wafer at the position around the movable connection rod when the wafer is seated in the boat.

5. The semiconductor wafer cleaning apparatus according to claim 1, wherein said boat drive unit comprises:
    a boat lifting motor vertically moving the wafer boat upward or downward;
    a boat rotating motor installed on a wafer holding panel capable of vertically moving in opposite directions by the boat lifting motor; and
    a rotating shaft connected to an upper plate of said boat and rotated by said boat rotating motor.

6. The semiconductor wafer cleaning apparatus according to claim 1, wherein said bath comprises:
    a double-walled cylindrical body, with a space formed between inner and outer walls of the body and divided into a a liquid injection chamber and a liquid discharge chamber;
    a liquid injection pipe connected to said liquid injection chamber and feeding the wafer cleaning liquid to the liquid injection chamber, with a plurality of liquid injection nozzles formed on the inner wall to inject the liquid from the liquid injection chamber into an interior of the inner wall;
    a liquid discharge pipe connected to said liquid discharge chamber and discharging the liquid from the liquid discharge chamber, with a plurality of liquid discharge nozzles formed on the inner wall to discharge the liquid from the interior of the inner wall to the liquid discharge chamber; and a liquid drain port formed on a bottom wall of said bath, with a flow control valve provided at said liquid drain port for closing or opening the liquid drain port.

7. The semiconductor wafer cleaning apparatus according to claim 6, wherein said liquid injection and discharge chambers are sealed from each other, with a plurality of impurity drain ports formed on the sidewall of said bath to communicate with the outside of the bath, and a top edge of said outer wall of the double-walled bath being higher than that of the inner wall, thus allowing impurities laden in the wafer cleaning liquid to be drained from the interior of the inner wall to the impurity drain ports while flowing over the top edge of said inner wall prior to being drained to the outside of said bath.

* * * * *